United States Patent
Nasu et al.

(10) Patent No.: US 6,778,402 B2
(45) Date of Patent: Aug. 17, 2004

(54) ELECTRONIC CONTROL UNIT SNAP-FITTED TO SUPPORTING BRACKET

(75) Inventors: Shoji Nasu, Gamagori (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/449,070

(22) Filed: Jun. 2, 2003

(65) Prior Publication Data

US 2004/0017667 A1 Jan. 29, 2004

(30) Foreign Application Priority Data

Jul. 26, 2002 (JP) ........................................ 2002-217885

(51) Int. Cl.[7] ............................. H05K 5/00; H05K 5/04
(52) U.S. Cl. ...................... 361/756; 361/740; 361/741; 361/747; 361/759; 361/801; 361/802; 312/223.2; 174/50.52
(58) Field of Search .................................. 361/683–686, 361/724–728, 731–733, 740–741, 747, 756, 758, 801–803, 807, 809, 810, 825; 174/50, 50.51, 50.52, 50.54, 66, 67; 312/223.2, 223.1, 333, 265.5, 265.6, 330.1; 439/327, 575, 553

(56) References Cited

U.S. PATENT DOCUMENTS 5,481,431 A * 1/1996 Siahpolo et al. ............ 361/685

FOREIGN PATENT DOCUMENTS

| JP | A-H07-288120 | 10/1995 |
| JP | A-2001-67141 | 3/2001 |

* cited by examiner

Primary Examiner—Phuong T. Vu
(74) Attorney, Agent, or Firm—Posz & Bethards, PLC

(57) ABSTRACT

A circuit board on which various electronic components are mounted is contained in a box-shaped resin case. The case is mounted on a bracket made of an iron plate by snap-fitting projections formed on the case to resilient hooks formed on the bracket. To correctly align the projections with respective resilient hooks by pushing down the case toward the bracket in a process of mounting the case on the bracket, a guiding projection slidably contacting one of the hooks and generating a thrusting force is formed on the case. The case is correctly engaged with the bracket by simply pushing down the case toward the bracket because the case is guided by the guiding projection. Thus, the case can be easily mounted on the bracket without fail.

4 Claims, 6 Drawing Sheets

<u>PRIOR ART</u>

ELECTRONIC CONTROL UNIT SNAP-FITTED TO SUPPORTING BRACKET

CROSS-REFERENCE TO RELATED APPLICATION

This application is based upon and claims benefit of priority of Japanese Patent Application No. 2002-217885 filed on Jul. 26, 2002, the content of which is incorporated herein by reference.

BACKGROUND OF THE INVENTION

1. Field of the Invention

The present invention relates to an electronic control unit mounted on a supporting bracket by snap-fitting and a structure for snap-fitting the electronic control unit to the supporting bracket.

2. Description of Related Art

A conventional structure for mounting an electronic control unit for use in an automotive vehicle on a supporting bracket will be described with reference to FIGS. 6–11 attached hereto. As shown in FIG. 6, an electronic control unit 1 having a case 40 mounted on a bracket 20 is fixed to a stay 10 positioned in an inside space of an instrument panel. The bracket 20 is connected to a pair of angled supports 30a, 30b which are fixed to the stay 10 by screws 300a, 300b.

As shown in FIG. 7, the case 40 is box-shaped and has a front opening 41, through which a circuit board 60 carrying electronic components thereon is inserted or taken out. A connector 61 is mounted on the circuit board 60 at its front end. After the circuit board 60 is inserted into the case 40, the front opening 41 is covered with a front cover 50. As shown in FIG. 8, the case 40 includes a rear wall 42 positioned opposite to the front opening 41 and sidewalls 43, 44. A rear projection 42a is formed on the rear wall 42, a pair of side projections 43a, 43b are formed on the sidewall 43, and another pair of side projections 44a, 44b are formed on the other sidewall 44. Each projection has a rectangular plane surface and is projected from the respective wall by a certain height.

The bracket 20 is made of an iron plate, and includes a bottom wall 21, a resilient rear hook 22 and four resilient side hooks 23–26 as shown in FIG. 9. Each hook is bent upwardly form the bottom wall 21, and its angle relative to the bottom wall 21 can be resiliently widened when the case 40 is mounted on the bracket 20. The resilient rear hook 22 has a hole 220 that engages with the rear projection 42a formed on the rear wall 42 of the case 40. Similarly, the resilient side hooks 23–26 have respective holes 230–260 that engage with the side projections 43a, 43b, 44a, 44b, respectively.

Referring to FIGS. 10 and 11, a process for mounting the case 40 on the bracket 20 will be described. The circuit board 60 is inserted into the case 40, and the opening 41 is closed with the front cover 50. As shown in FIG. 10, the case 40 is placed on the bracket 20, so that the rear projection 42a faces the resilient rear hook 22, and side projections 43a, 43b, 44a, 44b face the resilient side hooks 23, 24, 25, 26, respectively. Then, the case 40 is forcibly pushed toward the bottom wall 21 of the bracket 20 to resiliently widen the respective hooks. As shown in FIG. 11, the case 40 has to be also pushed toward the resilient rear hook 22 against its resilient force. Thus, all the projections formed on the case 40 are snap-fitted to the holes 220–260 formed in the respective resilient hooks 22–26 of the bracket 20. In this manner, the case 40 is fixedly mounted on the bracket 20.

However, in the conventional mounting structure described above, the case 40 is pushed back by the spring-back force of the resilient rear hook 22. Therefore, the side projections may not be correctly aligned with the respective resilient side hooks. In this case, the projections do not engage with the resilient hooks. To correctly position the case 40 relative to the bracket 20, it is conceivable to provide an additional projection on the front cover 50 and another hook that engages with the additional projection on the bracket 20. However, such is not practical because the circuit board 60 cannot be taken out from the case 40 after the case 40 is mounted on the bracket 20 if the front cover 50 is connected to the bracket 20.

SUMMARY OF THE INVENTION

The present invention has been made in view of the above-mentioned problem, and an object of the present invention is to provide an improved electronic control unit that can be easily and firmly snap-fitted to a bracket. Another object of the present invention is to provide an improved structure for snap-fitting the electronic control unit to the bracket.

An electronic control unit includes a box-shaped case and a circuit board on which various electronic components are mounted. The circuit board is inserted into the case from a front opening of the case, and the front opening is closed with a front cover after the circuit board is inserted. The electronic control unit is mounted on a bracket by snap-fitting projections of the case to resilient hooks of the bracket. A rear projection is formed on a rear wall of the case and a pair of side projections is formed on each sidewall of the case. The case is made of a resin material, and all the projections are integrally formed with the case. The bracket is made of an iron plate, and the resilient hooks stand upwardly from a bottom wall of the bracket. A guiding projection is also formed on at least one of the sidewalls of the case. When the case is mounted on the bracket, the guiding wall guides the case to align the projections with the respective resilient hooks with which the projections engage.

To mount the case on the bracket, the case is placed on the bracket so that projections roughly align with the respective resilient hooks. The case is further pushed down toward the bracket, resiliently widening the resilient hooks, to thereby allow the projections to engage with the hooks. At the same time, the case is pushed toward the rear side against a resilient force of the rear hook by a thrusting force of the guiding projection. Preferably, a sloped surface slidably contacting one of the resilient hooks is formed on the guiding projection to effectively generate the thrusting force. In this manner, all the projections of the case are aligned with and snap-fitted to the respective resilient hooks by simply pushing down the case toward the bracket. Thus, the electronic control unit is easily mounted on the bracket without fail.

Other objects and features of the present invention will become more readily apparent from a better understanding of the preferred embodiment described below with reference to the following drawings.

DETAILED DESCRIPTION OF THE PREFERRED EMBODIMENT

A preferred embodiment of the present invention will be described with reference to FIGS. 1–5. Only parts or structures that are different from those in the conventional electronic control unit are differently numbered in FIGS. 1–5, and other parts and structures that are the same as those in the conventional unit have the same reference numbers.

Figure 1:
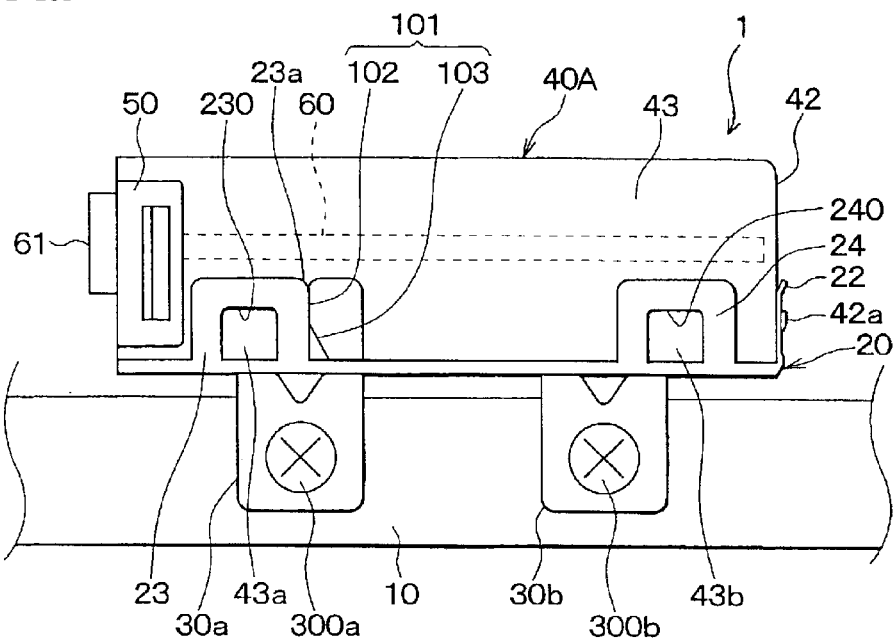
FIG. 1 is a side view showing an electronic control unit mounted on a stay.

As shown in FIG. 1, an electronic control unit 1 composed of a case 40A, a circuit board 60 contained in the case 40A and a front cover 50 is fixed to a bracket 20. The bracket 20, to which the electronic control unit 1 is fixed, is connected to a pair of angled supports 30a, 30b. The pair of angled supports 30a, 30b is connected to a stay 10 of an automobile with screws 300a, 300b. Thus, the electronic control unit 1 is fixedly mounted on the automobile.

Figure 2:
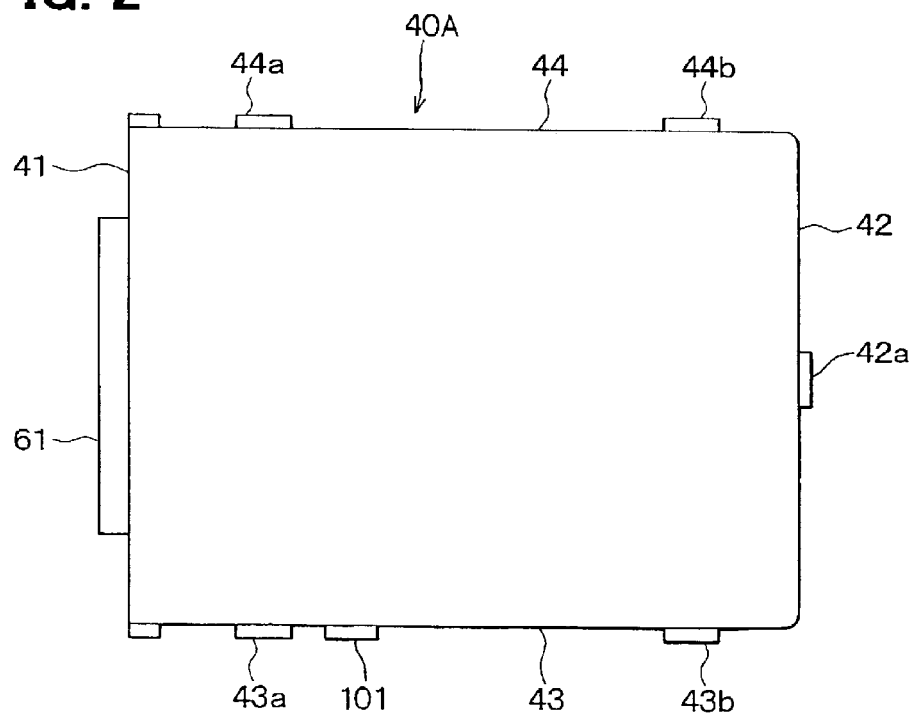
FIG. 2 is a top view showing the electronic control unit.
Figure 3:
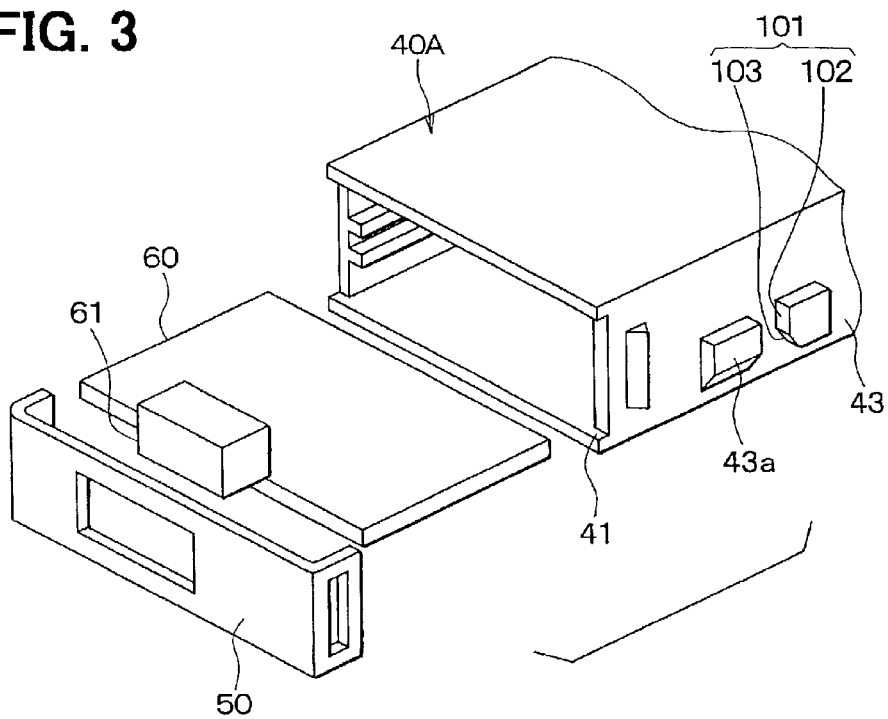
FIG. 3 is an exploded perspective view showing the electronic control unit.
Figure 8:
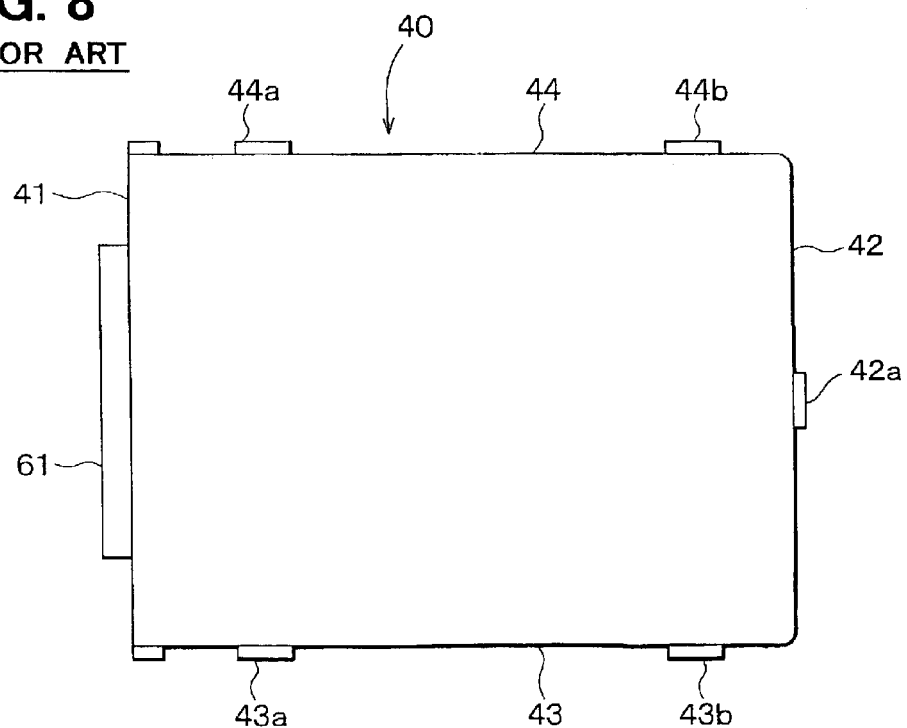
FIG. 8 is a top view showing the conventional electronic control unit.
Figure 9:
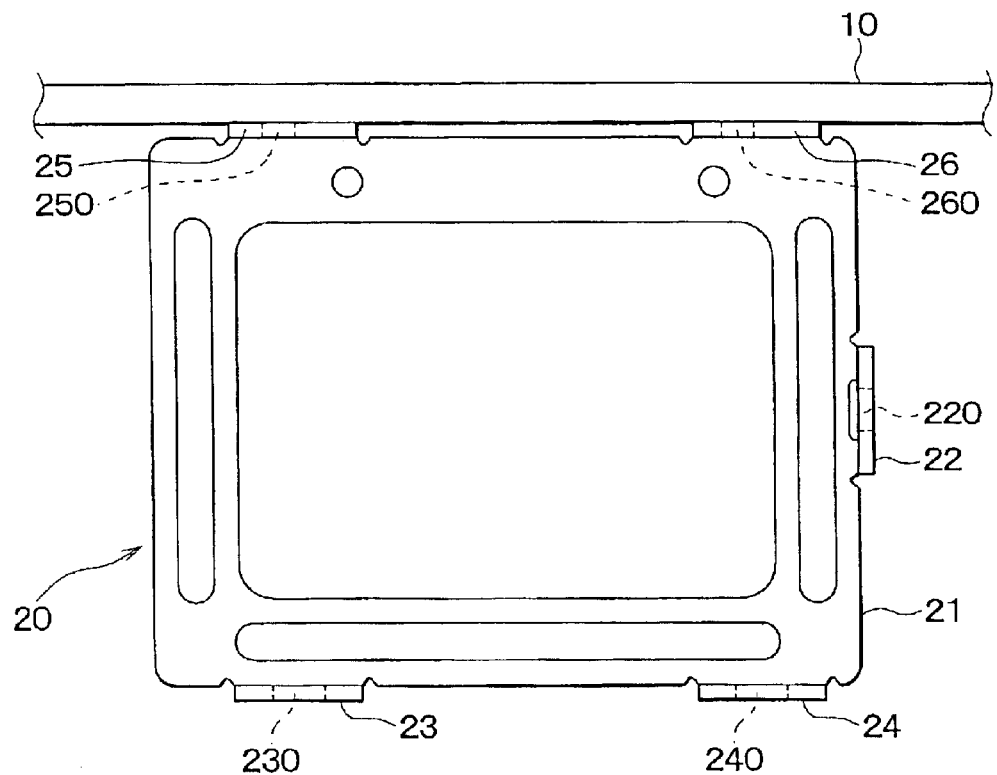
FIG. 9 is a plan view showing a bracket on which the electronic control unit is mounted.
Figure 10:
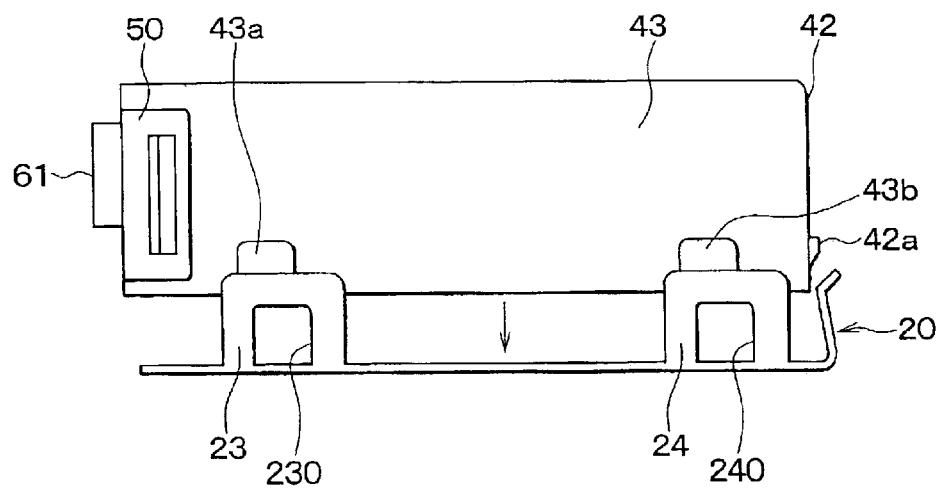
FIGS. 10 and 11 are drawings showing a process of mounting the conventional electronic control unit on the bracket.
Figure 11:
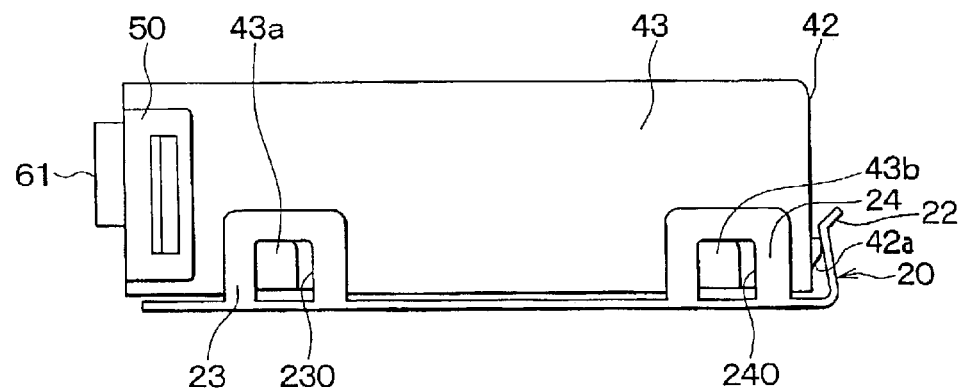

As shown in FIG. 2, the case 40A is similar to the conventional case 40 shown in FIG. 8, but a guiding projection 101 is additionally formed on the sidewall 43. The guiding projection 101 includes a straight surface 102 and a sloped surface 103 as shown in FIG. 3. The guiding projection 101 functions so as to correctly align all the projections of the case 40A with the respective resilient hooks of the bracket 20. The sloped surface 103 abuts a corner portion 23a of the resilient side hook 23, and the corner portion 23a slides on the sloped surface 103 when the case 40A is pushed downwardly toward the bracket 20. In this manner, a force pushing the case 40A toward the resilient rear hook 22 against its resilient force is generated. The straight surface 102 contacts one side of the side hook 23 after the case 40A is snap-fitted to the bracket 20 to thereby keep the case 40A at its mounted position.

Figure 4:
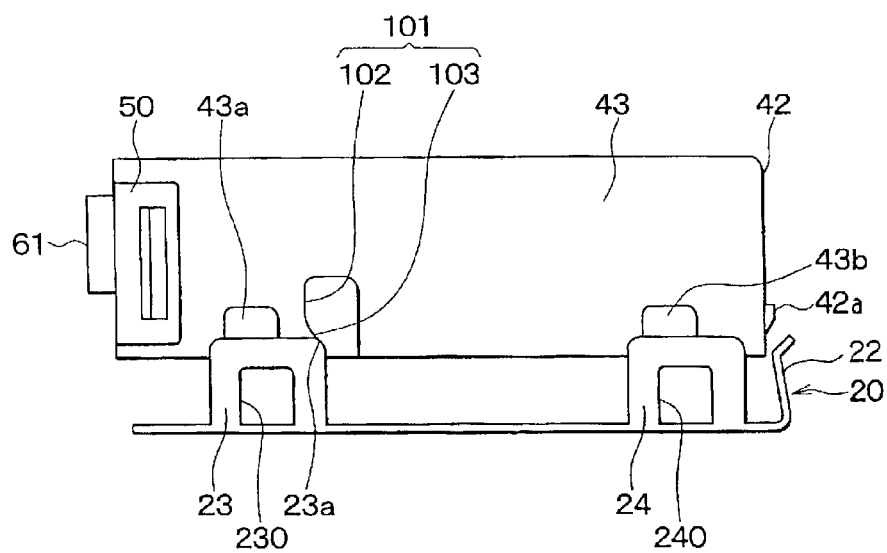
FIGS. 4 and 5 are drawings showing a process of mounting the electronic control unit on a bracket.
Figure 5:
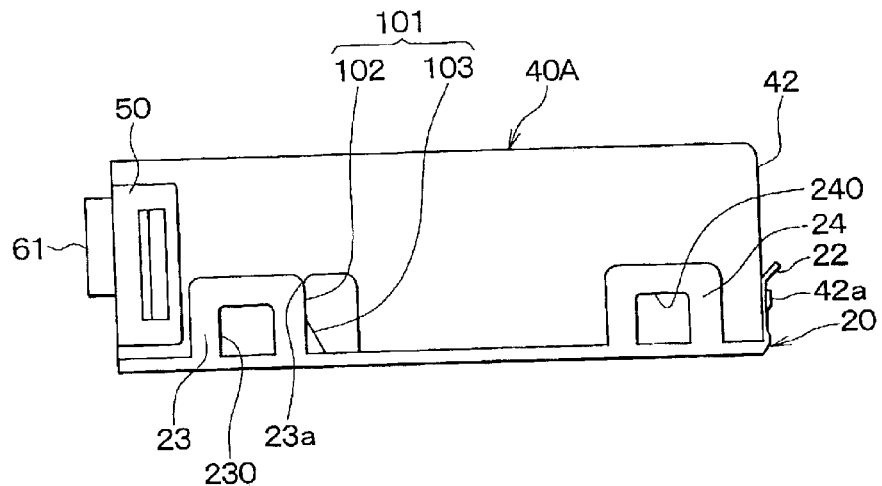
Figure 6:
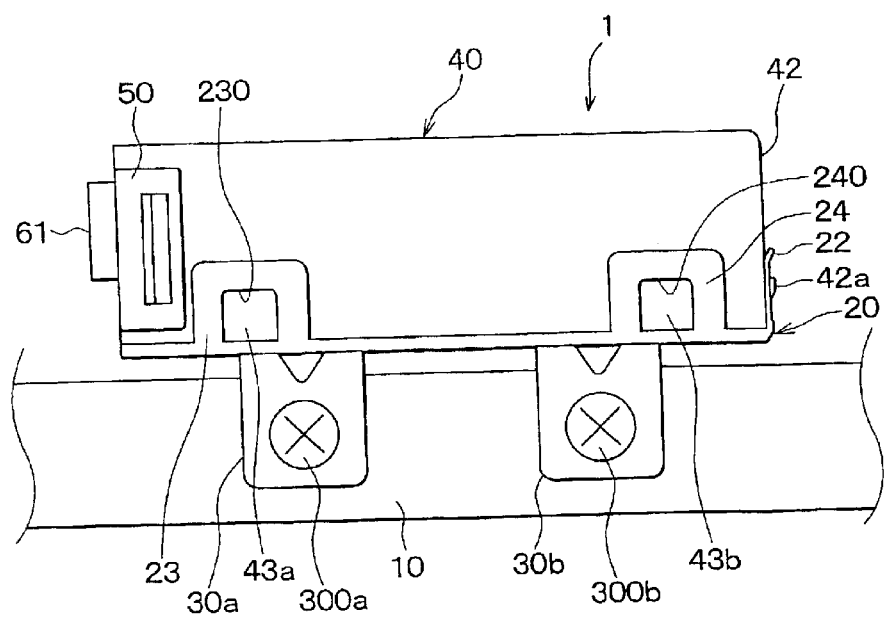
FIG. 6 is a side view showing a conventional electronic control unit mounted on a stay.
Figure 7:
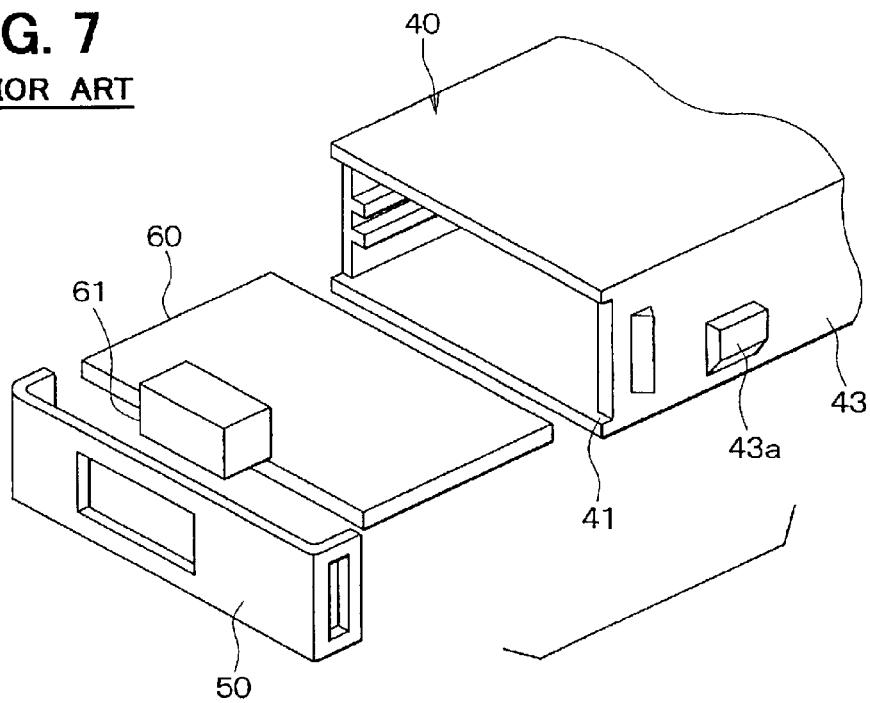
FIG. 7 is an exploded perspective view showing the conventional electronic control unit.

Referring to FIGS. 4 and 5, a process of snap-fitting the case 40A to the bracket 20 will be described. As shown in FIG. 4, the case 40A is placed on the bracket 20 so that the projections of the case 40A roughly align with the resilient hooks of the bracket 20 and the sloped surface 103 abuts the corner portion 23a of the side hook 23. Then, the case 40A is pushed down toward the bottom wall 21 of the bracket 20. As the case 40A is pushed down, all of the resilient hooks 22–26 are pushed by the respective projections 42a, 43a, 43b, 44a, 44b and resiliently deformed to allow the case 40A to be further pushed down. At the same time, a force for thrusting the case 40A toward the resilient rear hook 22 is generated because the corner portion 23a of the resilient side hook 23 slides on the sloped surface 103 of the guiding projection 101. In this manner, all the projections are snap-fitted to holes 220–260 formed in the respective resilient hooks.

After the case 40A is mounted on the bracket 20, the straight surface 102 of the guiding projection 101 contacts the side of the resilient side hook 23 as shown in FIG. 5, thereby preventing the case 40A from being pushed back to the front side by the spring-back force of the resilient rear hook 22. Thus, the case 40A is firmly connected to the bracket 20.

As explained above, the case 40A is pushed toward the resilient rear hook 22 against its resilient force by the thrusting force generated by the sloped surface 103 of the guiding projection 101 at the same time when the case 40A is pushed down. Therefore, all the projections of the case 40A are correctly aligned with the respective resilient hooks of the bracket 20. Accordingly, the projections are easily snap-fitted to the respective holes of the resilient hooks. Thus, the case 40A can be correctly mounted on the bracket 20 without fail.

The present invention is not limited to the embodiment described above, but it may be variously modified. For example, the guiding projection 101 may be modified to have only the straight surface 102, as long as the straight surface 102 is formed to easily engage with the corner portion 23a of the side hook 23. The mounting position of the electronic control unit 1 in an automobile is not limited to the inside of the instrument panel. It may be mounted on other places in the automobile. Though the bracket 20 is fixed to the stay 10 of the automobile via a pair of angled supports 30a, 30b in the foregoing embodiment, the bracket 20 may be directly fixed to the stay 10. One rear projection is formed on the rear wall 42, and a pair of side projections is formed on each sidewall 43, 44 in the foregoing embodiment. The number of the projections, however, is not limited to such numbers, but it may be arbitrarily selected according to respective design needs. Though the guiding projection 101 is formed to contact the side of the side hook 23 in the foregoing embodiment, two guiding projections may be formed on the sidewall 43 so that they contact the side hooks 23 and 24, respectively. Further, the electronic control unit 1 mounted on the bracket 20 may be used in devices other than the automobile.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An electronic control unit to be snap-fitted to a bracket, the electronic control unit comprising:
 a box-shaped case; and
 a circuit board on which electronic components are mounted, the circuit board being contained in the case, wherein the case comprises:
  a front opening from which the circuit board is inserted;
  a rear projection formed on a rear wall of the case, the rear projection being adapted to be snap-fitted to a resilient rear hook formed on the bracket; side projections formed on sidewalls of the case, the side projections being adapted to be snap-fitted to respective resilient side hooks formed on the bracket; and
  a guiding projection formed on at least one of the sidewalls, the guiding projection guiding the case to align the side projections with the resilient side hooks when the case is mounted on the bracket, wherein the guiding projection includes a sloped surface slidably contacting a corner portion of the resilient side hook to thereby rush the case toward the resilient rear hook against a resilient force thereof when the case is mounted on the bracket.

2. The electronic control unit as in claim 1, wherein:
 the case is made of a resin material; and
 the rear projection, the side projections and the guiding projection are integrally formed with the case.

3. The electronic control unit as in claim 1, wherein:
 a pair of side projections are formed on each sidewall of the case.

4. A structure for snap-fitting an electronic control unit to a bracket, the electronic control unit including a box-shaped case and a circuit board inserted into the box-shaped case from its front opening, the snap-fitting structure comprising:

a rear projection formed on a rear wall of the box-shaped case and adapted to be snap-fitted to a resilient rear hook formed on the bracket;

side projections formed on the sidewalls of the box-shaped case and adapted to be snap-fitted to respective resilient side hooks formed on the bracket; and a guiding projection formed on at least one of the sidewalls of the box-shaped case, the guiding projection guiding the box-shaped case, when the electronic control unit is mounted on the bracket, to align the side projections with the resilient side hooks, wherein the guiding projection includes a sloped surface slidably contacting a corner portion of the resilient side hook to thereby push the case toward the resilient rear hook against a resilient force thereof when the case is mounted on the bracket.

* * * * *